United States Patent
Le Rhun

(10) Patent No.: US 11,758,816 B2
(45) Date of Patent: Sep. 12, 2023

(54) METHOD OF FORMING A PIEZO-ELECTRIC TRANSDUCING DEVICE

(71) Applicant: Commissariat A L'Energie Atomique et aux Energies Alternatives, Paris (FR)

(72) Inventor: Gwenael Le Rhun, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 599 days.

(21) Appl. No.: 16/445,279

(22) Filed: Jun. 19, 2019

(65) Prior Publication Data

US 2020/0013947 A1    Jan. 9, 2020

(30) Foreign Application Priority Data

Jun. 22, 2018 (FR) ...................... 18 55593

(51) Int. Cl.
*H10N 30/072* (2023.01)
*H10N 30/073* (2023.01)
(Continued)

(52) U.S. Cl.
CPC ......... *H10N 30/072* (2023.02); *H10N 30/071* (2023.02); *H10N 30/073* (2023.02);
(Continued)

(58) Field of Classification Search
CPC ... H01L 41/312; H01L 41/313; H01L 41/319; H01L 41/0477; H01L 41/081; H01L 41/1876

See application file for complete search history.

(56) References Cited

U.S. PATENT DOCUMENTS

2002/0006024 A1* 1/2002 Pulsford ................. H03H 3/00
                                                   361/313
2002/0066525 A1 6/2002 Wada et al.
(Continued)

FOREIGN PATENT DOCUMENTS

EP    2144309 A1 * 1/2010 ............ B41J 2/1628
FR    2950 197 A1    3/2011
(Continued)

OTHER PUBLICATIONS

French Preliminary Search Report dated Mar. 8, 2019 in French Application 18 55593, filed on Jun. 22, 2018 (with English Translation of Categories of Cited Documents).

(Continued)

*Primary Examiner* — Jeffrey T Carley
(74) *Attorney, Agent, or Firm* — Oblon, McClelland, Maier & Neustadt, L.L.P.

(57) ABSTRACT

A method for producing a piezoelectric transducer device is provided, including a membrane including at least one silicon and/or silicon nitride layer; a piezoelectric layer including at least one piezoelectric material with crystalline perovskite structure and arranged on the membrane; first and second electrodes electrically in contact with the piezoelectric layer; and in which the piezoelectric layer is in direct contact with the silicon and/or silicon nitride layer, or in which the piezoelectric layer is in contact with the silicon and/or silicon nitride layer solely through one or more metal layers.

18 Claims, 4 Drawing Sheets

(51) Int. Cl.
*H10N 30/079* (2023.01)
*H10N 30/87* (2023.01)
*H10N 30/00* (2023.01)
*H10N 30/071* (2023.01)
*H10N 30/853* (2023.01)

(52) U.S. Cl.
CPC ..... *H10N 30/079* (2023.02); *H10N 30/10513* (2023.02); *H10N 30/877* (2023.02); *H10N 30/8554* (2023.02)

(56) References Cited

U.S. PATENT DOCUMENTS

| | | | |
|---|---|---|---|
| 2003/0062804 A1* | 4/2003 | Uchiyama | G11B 5/5552 |
| 2003/0186521 A1* | 10/2003 | Kub | H01L 41/313 438/558 |
| 2003/0196745 A1 | 10/2003 | Fukui et al. | |
| 2003/0234075 A1* | 12/2003 | Aspar | B81C 1/0038 156/752 |
| 2005/0017313 A1* | 1/2005 | Wan | B81C 1/00095 257/E29.323 |
| 2005/0048540 A1* | 3/2005 | Inami | B01L 3/5027 435/287.2 |
| 2005/0067920 A1 | 3/2005 | Weinberg et al. | |
| 2007/0090729 A1* | 4/2007 | Ohwada | H01L 41/314 310/358 |
| 2007/0152537 A1* | 7/2007 | Yamaguchi | H01L 41/313 310/311 |
| 2007/0220722 A1* | 9/2007 | Furuya | B41J 2/1642 29/25.35 |
| 2010/0141097 A1* | 6/2010 | Li | H01L 41/316 204/192.18 |
| 2011/0061215 A1 | 3/2011 | Defay et al. | |
| 2012/0319535 A1* | 12/2012 | Dausch | H01L 41/29 310/365 |
| 2013/0264912 A1* | 10/2013 | Kwon | H01L 41/27 264/405 |
| 2015/0224324 A1* | 8/2015 | Lee | B32B 38/10 156/247 |
| 2017/0141750 A1* | 5/2017 | Pelzel | H01L 23/66 |
| 2022/0166398 A1* | 5/2022 | Bousquet | H01L 41/312 |

FOREIGN PATENT DOCUMENTS

| | | | | |
|---|---|---|---|---|
| JP | 2002217390 A | * | 8/2002 | |
| JP | 2002217391 A | * | 8/2002 | |
| JP | 2011-212869 | | 10/2011 | |
| WO | WO-0209160 A2 | * | 1/2002 | .......... H03H 9/0542 |
| WO | WO-2006132380 A2 | * | 12/2006 | ....... H01L 21/31691 |

OTHER PUBLICATIONS

Goto, H., et al., "Microfocusing optical device using piezoelectric thin-film actuator", Micro-Optics/Micromechanics and Laser Scanning and Shaping, vol. 2383, 1995, pp. 136-143.

Kanno, I., et al., "Development of Deformable Mirror Composed of Piezoelectric Thin Films for Adaptive Optics", IEEE Journal of Selected Topics in Quantum Electronics, vol. 13, No. 2, 2007, pp. 155-161.

Maszara, W.P., et al., "Bonding of silicon wafers for silicon-on-insulator", Journal of Applied Physics 64, 1988, 9 pages.

* cited by examiner

METHOD OF FORMING A PIEZO-ELECTRIC TRANSDUCING DEVICE

TECHNICAL FIELD AND PRIOR ART

The invention pertains to the production of a piezoelectric transducer device with crystalline perovskite structure piezoelectric material, notably of MEMS (micro electro mechanical system) and/or NEMS (nano electro mechanical system) type. The invention advantageously applies to the production of piezoelectric transducer devices corresponding to actuators, sensors or devices for recovering vibratory energy. The invention may also apply to the production of pyroelectric sensors (the pyroelectric material also being piezoelectric).

During the production of a transducer device with crystalline perovskite structure piezoelectric material, the piezoelectric material is deposited on a silicon substrate from which a silicon membrane is produced, or directly on a silicon or silicon nitride membrane arranged on a substrate. To implement this deposition correctly, the presence of a $SiO_2$ layer between the piezoelectric material and the silicon or silicon nitride is necessary in order to avoid disbondments which can occur at the interface between the piezoelectric material and the silicon or silicon nitride following the crystallisation annealing of the piezoelectric material which is implemented at high temperature (for example at around 700° C.). This is particularly critical when the piezoelectric material, corresponding for example to PZT ($Pb(Zr_x,Ti_{1-x})O_3$), is deposited by a sol-gel method. Moreover, the $SiO_2$ layer plays the role of diffusion barrier for lead coming from the PZT and which is diffused during the annealing of the PZT.

The $SiO_2$ layer arranged between the piezoelectric material and the silicon or silicon nitride is not however always desirable. For example, this $SiO_2$ layer may be restrictive on account of the compressive stress that it introduces within of the stack of materials of the piezoelectric transducer device.

Another problem encountered during the production of such a transducer device with crystalline perovskite structure piezoelectric material and which comprises interdigitated electrodes arranged on a single face of the piezoelectric layer is the absence of a metal layer, for example platinum, between the piezoelectric layer and the substrate or the silicon or silicon nitride membrane, making the growth of the piezoelectric material on the substrate or the membrane very complicated.

DESCRIPTION OF THE INVENTION

There thus exists a need to propose a method for producing a transducer device with crystalline perovskite structure piezoelectric material of which the structure makes it possible, during the production thereof, to avoid the disbondments that can occur under the piezoelectric material during the production thereof, and this is so without the presence of a $SiO_2$ layer under the piezoelectric material, and also resolving the problems of producing the piezoelectric material encountered when the electrodes of the device are only arranged on a single face of the piezoelectric layer.

To do so, the production of a piezoelectric transducer device is proposed, comprising at least:
a membrane including at least one silicon and/or silicon nitride layer;
a piezoelectric layer including at least one piezoelectric material with crystalline perovskite structure and arranged on the membrane;
first and second electrodes electrically in contact with the piezoelectric layer;
and in which the piezoelectric layer is in direct contact with the silicon and/or silicon nitride layer of the membrane, or in which the piezoelectric layer is in contact with the silicon and/or silicon nitride layer of the membrane solely through one or more electrically conductive layers.

With such a structure, the piezoelectric transducer device may thus be produced by forming the piezoelectric layer not on the silicon and/or silicon nitride layer of the membrane, but on a temporary substrate. The piezoelectric layer may thus be transferred onto the final substrate after having undergone one or more crystallisation annealings, which does not damage the interface formed under the piezoelectric layer after its transfer onto the final substrate. No $SiO_2$ layer is thus necessary between the silicon and/or silicon nitride layer of the membrane and the piezoelectric layer, without this bringing about problems of disbandment of the piezoelectric layer.

The absence of a $SiO_2$ layer at the interface between the membrane and the piezoelectric layer also has the consequence of not introducing compressive stress at this location of the produced stack.

In addition, the piezoelectric layer may be in direct contact with the silicon and/or silicon nitride layer of the membrane, without a metal layer between the membrane and the piezoelectric layer, because given that the piezoelectric layer may be produced on a temporary substrate, a metal layer serving for the production of the piezoelectric layer is not found between the piezoelectric layer and the membrane.

The membrane may be formed of at least one silicon layer, or at least one silicon nitride layer, or a stack of at least one silicon layer and at least one silicon nitride layer.

In an alternative, the membrane may comprise at least one $SiO_2$ layer arranged between two silicon and/or silicon nitride layers. In this case, the $SiO_2$ layer is not in direct contact with the piezoelectric layer.

The first and second electrodes are electrically in contact with the piezoelectric layer, that is to say are either in direct contact with the piezoelectric layer, or in contact therewith through one or more electrically conductive layers.

When the piezoelectric layer is in direct contact with the silicon and/or silicon nitride layer of the membrane, no intermediate material is arranged between the piezoelectric layer and the silicon and/or silicon nitride layer of the membrane. When the piezoelectric layer is in contact with the silicon and/or silicon nitride layer of the membrane solely through one or more electrically conductive layers, this signifies notably that no material dielectric such as $SiO_2$ is arranged between the membrane and the piezoelectric layer.

In a first embodiment, the first electrode may be arranged against (directly or not, that is to say with optionally one or more electrically conductive materials arranged between the first electrode and the piezoelectric layer) a first face of the piezoelectric layer, and the second electrode may be arranged on the side of a second face of the piezoelectric layer opposite to the first face of the piezoelectric layer, between the piezoelectric layer and the silicon and/or silicon nitride layer of the membrane. One or more electrically conductive materials may be arranged between the second electrode and the piezoelectric layer.

In a second embodiment, the first and second electrodes may be arranged against (directly or not, that is to say with optionally one or more electrically conductive materials arranged between the first and second electrodes and the piezoelectric layer) a first face of the piezoelectric layer, and the silicon and/or silicon nitride layer of the membrane may be in direct contact with a second face of the to piezoelectric layer opposite to the first face of the piezoelectric layer.

Advantageously, the piezoelectric material may be PZT.

A method is also proposed for producing a piezoelectric transducer device, comprising at least:

producing, on a face of a first substrate, first and second separation layers arranged one against the other and such that the first separation layer is arranged between the first substrate and the second separation layer;

producing, on the second separation layer, at least one piezoelectric layer including at least one piezoelectric material with crystalline perovskite structure;

making the piezoelectric layer integral with a second substrate, forming a stack of different materials in which the piezoelectric layer is arranged between the second substrate and the second separation layer, and in which at least one membrane including at least one silicon and/or silicon nitride layer is arranged between the piezoelectric layer and the second substrate such that the piezoelectric layer is in direct contact with the silicon and/or silicon nitride layer of the membrane, or that the piezoelectric layer is in contact with the silicon and/or silicon nitride layer of the membrane solely through one or more electrically conductive layers;

mechanical separation at an interface between the first and second separation layers, such that the first separation layer remains integral with the first substrate and that the second separation layer remains integral with the piezoelectric layer;

further comprising, in the course of the method, the production of first and second electrodes electrically in contact with the piezoelectric layer, and in which the materials of the stack are chosen such that the interface between the first and second separation layers corresponds to that, among all the interfaces of the stack, having the lowest adherence force, and in which:

one of the first and second separation layers comprises at least $SiO_2$ and/or silicon nitride and the other of the first and second separation layers comprises at least one noble metal, and/or the method comprises, between the step of producing first and second separation layers and the making integral step, the implementation of at least one step reducing an initial adherence force of the interface between the first and second separation layers.

In this method, the interface at which the mechanical separation is carried out may be defined beforehand by a judicious choice of the materials of the first and second separation layers bringing about naturally a low adherence force at this interface. By using on one side a noble metal and on the other $SiO_2$ and/or silicon nitride to form the first and second separation layers, a low adherence force is obtained at the interface of these two separation layers, without having to implement a specific step. Thus, after having made the piezoelectric layer integral with the second substrate, the mechanical separation carried out at the interface between the first and second separation layers does not degrade the other layers because it is the interface between the first and second separation layers that has the lowest adherence force among all the interfaces of the stack of materials obtained after the making integral step.

The use of a noble metal to form one of the first and second separation layers has the advantage of avoiding oxidation of this separation layer on contact with the other separation layer which comprises $SiO_2$ and/or silicon nitride, notably when significant thermal budgets are reached in the course of the method, for example at temperatures greater than around 450° C., as is the case when the crystalline perovskite structure material is crystallised/densified.

In an alternative or as a complement to the production of the first and second separation layers from a noble metal and $SiO_2$ and/or silicon nitride, the adherence force at the interface between the first and second separation layers may be reduced by implementing a specific step, such as for example the formation of cavities at this interface.

The metal used to form one of the first and second separation layers may correspond to an oxidation resistant metal.

The transfer method described here may advantageously serve for the production of components forming electromechanical transducers integrating materials that are going to make it possible to fulfil actuator and/or sensor functions. The sensor function is obtained by direct piezoelectric effect (a mechanical stress causes the appearance of electrical charges in the material) whereas the actuator function is obtained by reverse piezoelectric effect (in this case an electric polarisation external to the material causes a mechanical deformation of the latter).

In addition, at the end of the mechanical separation at the interface between the first and second separation layers, the first substrate is not destroyed and may be reused.

Throughout the document, the term "on" is used without distinction of the orientation in space of the element to which this term relates. For example, in the characteristic "on one face of the first substrate", this face of the first substrate is not necessarily oriented upwards but may correspond to a face oriented along any direction. Moreover, the arrangement of a first element on a second element should be understood as being able to correspond to the arrangement of the first element directly against the second element, without any intermediate element between the first and second elements, or instead being able to correspond to the arrangement of the first element on the second element with one or more intermediate elements arranged between the first and second elements.

The expression "all the interfaces of the stack" designates all the interfaces formed between two successive layers (arranged one directly against the other) of the stack.

The separation layer comprising $SiO_2$ and/or silicon nitride may correspond to a $SiO_2$ or silicon nitride layer, or to a stack of $SiO_2$ and silicon nitride.

The noble metal corresponds to one or more of the following materials: platinum (Pt), gold (Au), silver (Ag), rhodium (Rh), osmium (Os), palladium (Pd), ruthenium (Ru), and iridium (Ir).

When the noble metal is intended to be exposed to strong thermal budgets, for example up to a temperature equal to around 850° C., this noble metal advantageously comprises platinum and/or palladium. When the noble metal is intended to be exposed to lower temperatures, such as for example temperatures less than or equal to around 400° C., other noble metals (Au, Ag, Rh, Os, Ru, Ir) may be used to form this noble metal layer.

The adherence force of the interface between the first and second separation layers may be less than or equal to around 1.5 $J/m^2$, or preferably less than or equal to around 1 $J/m^2$. As an example, the adherence force between the first and second separation layers with one including $SiO_2$ and the other platinum is equal to around 1 $J/m^2$.

The adherence force between two layers of materials may be measured by the so-called blade insertion method described for example in the document W. P. Mazsara et al., "Bonding of silicon wafers for silicon-on-insulator", Journal of Applied Physics 64, p. 4943, 1988).

The first substrate may comprise semiconductor, for example silicon.

The second substrate may comprise semiconductor, for example silicon.

The method may further comprise, between the step of producing the piezoelectric layer and the step of making the piezoelectric layer integral with the second substrate, a step of producing, on the piezoelectric layer, a first bonding layer including silicon and/or silicon nitride, and:

the making integral step may be implemented by direct bonding between the first bonding layer and a second bonding layer including silicon and/or silicon nitride and arranged on the second substrate;

the production of the membrane may comprise a step of producing a cavity in the second substrate such that a part of the first and second bonding layers arranged facing the cavity forms the membrane.

Thus, the first and second bonding layers serve both for the transfer of the layers of the device onto the second substrate and for the formation of the membrane.

In addition, the method may further comprise, between the step of producing the piezoelectric layer and the step of producing the first bonding layer, a step of producing, on the piezoelectric layer, at least one metal layer configured to form the second electrode of the device, and in which the first electrode is produced on the piezoelectric layer after the mechanical separation step.

Advantageously, the second separation layer may comprise the noble metal, and the first electrode may be produced by etching the second separation layer such that at least one remaining portion of the second separation layer forms the first electrode. Thus, apart from its role in obtaining a low adherence force between the first and second separation layers, this second separation layer may be conserved, after the mechanical separation step, to form the first electrode of the device.

In an alternative, the first bonding layer may be produced directly against the piezoelectric layer, and the first and second electrodes may be produced on the piezoelectric layer after the mechanical separation step.

Advantageously, the second separation layer may comprise the noble metal, and the first and second electrodes may be produced by etching the second separation layer such that the remaining portions of the second separation layer form the first and second electrodes having an interdigitated comb pattern. Here again, the second separation layer serves to obtain a low adherence force between the first and second separation layers, and, after the mechanical separation step, serves to form the first electrode of the device.

Moreover, the first bonding layer may comprise a first silicon and/or silicon nitride layer and a first $SiO_2$ layer such that the first silicon and/or silicon nitride layer is arranged between the first $SiO_2$ layer and the piezoelectric layer, and the second bonding layer may comprise a second silicon and/or silicon nitride layer and a second $SiO_2$ layer such that the second silicon and/or silicon nitride layer is arranged between the second $SiO_2$ layer and the second substrate.

In an alternative, the method may further comprise, between the step of producing the piezoelectric layer and the step of making the piezoelectric layer integral with the second substrate, a step of producing, on the piezoelectric layer, a first metal bonding layer, and:

the making integral step may be implemented by direct bonding or by thermocompression between the first metal bonding layer and a second metal bonding layer made integral with the second substrate through the silicon and/or silicon nitride layer of the membrane;

the production of the membrane may comprise a step of producing a cavity in the second substrate such that a part of the silicon and/or silicon nitride layer arranged facing the cavity forms at least one part of the membrane;

the first and second metal bonding layers may form together the second electrode of the device.

Advantageously, the second separation layer may comprise the noble metal, and the first electrode may be produced by etching the second separation layer such that at least one remaining portion of the second separation layer forms the first electrode.

Advantageously, the noble metal may comprise platinum, notably when the second separation layer comprising the noble metal is intended to form at least one of the electrodes of the device.

According to a particular embodiment, the method may be such that:

the piezoelectric material comprises lead;
the first separation layer comprises $SiO_2$;
said at least one step reducing the initial adherence force of the interface between the first and second separation layers comprises the implementation of at least one thermal treatment forming, at the interface between the first and second separation layers, an alloy of lead and $SiO_2$ in liquid phase, then a cooling forming cavities at the interface between the first and second separation layers.

Such cavities contribute, alone or as a complement to the materials chosen to form the first and second separation layers, to obtaining the low adherence force at the interface between the first and second separation layers.

BRIEF DESCRIPTION OF THE DRAWINGS

The present invention will be better understood on reading the description of exemplary embodiments given for only illustrative purposes and in no way limiting while referring to the appended drawings in which.

Identical, similar or equivalent parts of the different figures described hereafter bear the same numerical references so as to make it easier to go from one figure to the next.

The different parts shown in the figures are not necessarily shown according to a uniform scale, in order to make the figures more legible.

The different possibilities (alternatives and embodiments) should be understood as not being mutually exclusive and may be combined together.

DETAILED DESCRIPTION OF PARTICULAR EMBODIMENTS

Figure 1:
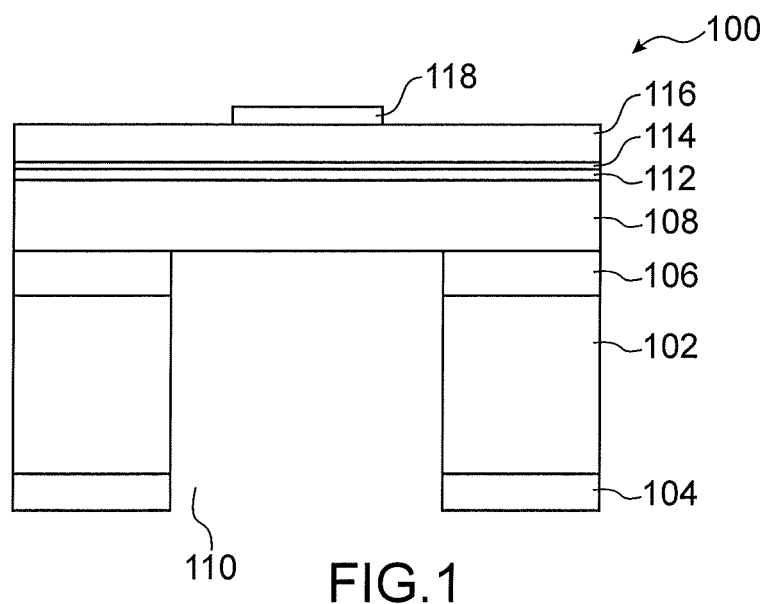
FIGS. 1 and 2 show a piezoelectric transducer device according to first and second embodiments.

A piezoelectric transducer device 100 according to a first embodiment is described below in relation with FIG. 1.

The device 100 comprises a substrate 102 serving as mechanical support. The substrate 102 here comprises semiconductor, for example silicon. The thickness of the substrate 102 is for example comprised between around 100 µm and 1 mm.

During the production of the device 100, the substrate 102 is subjected to an oxidation of its front and rear faces. This oxidation forms a first oxide layer 104 ($SiO_2$ in the present case) against its rear face and a second oxide layer 106 (also $SiO_2$ in the present case) against its front face. Each first and second oxide layers 104, 106 has for example a thickness comprised between around 0.5 µm and 1 µm (here equal to around 500 nm). The second oxide layer 106 serves notably, during the production of the device 100, as etching stop layer during the release of the membrane of the device 100 from the rear face of the substrate 102.

The device 100 also comprises at least one silicon and/or silicon nitride layer arranged on the second oxide layer 106 and which forms a membrane 108 of the device 100 thanks to a cavity 110 formed through the first and second oxide layers 104, 106 and through the substrate 102 (the cavity 110 being etched during the release of the membrane 108). The thickness of the membrane 108 is for example equal to around 1 µm and for example comprised between around 10 nm and 20 µm. The membrane 108 may comprise both silicon and silicon nitride when it is formed of a stack of these materials. In an alternative, it is possible that the membrane 108 comprises a $SiO_2$ layer arranged between two silicon and/or silicon nitride layers.

The device 100 also comprises an electrode, called second electrode 112, arranged on the membrane 108. The second electrode 112 comprises an electrically conductive material, for example platinum and/or ruthenium and/or iridium, $RuO_2$, Au, Cu, etc., and a thickness which is for example comprised between around 1 nm and 500 nm. In the exemplary embodiment described here, the second electrode 112 comprises platinum and has a thickness equal to around 100 nm.

The device 100 also comprises, on the second electrode 112, an optional tie layer 114 and serving, during the production of the device 100, to improve the quality of deposition of the electrically conductive material forming the second electrode 112. The presence or not of the tie layer 114 is a function notably of the adherence of the second electrode 112 on the piezoelectric layer 116. The tie layer 114 includes for example ruthenium and/or tungsten and/or chromium and/or titanium and/or $TiO_2$, and has a thickness for example comprised between around 0 nm and 10 nm. In the exemplary embodiment described here, the tie layer 114 comprises ruthenium and has a thickness equal to around 5 nm.

The device 100 also comprises a piezoelectric layer 116 arranged on the tie layer 114 (or on the second electrode 112 in the absence of the tie layer 114) and including a piezoelectric material with crystalline perovskite structure. This piezoelectric material corresponds for example to PZT (doped or not with La, Mn or Nb), KNN ($K_xNa_{1-x}NbO_3$), BST ($Ba_xSr_{1-x}TiO_3$), BCTZ ($Ba(Ti_xZr_{1-x})O_3$—$(Ba_yCa_{1-y})TiO_3$), PMN-PT ($PbMg_{1/3}Nb_{2/3}O_3$—$PbTiO_3$) or NBT-BT ($Na_xBi_yTiO_3$—$BaTiO_3$), and of which the thickness is for example comprised between around 1 nm and 100 µm and here equal to around 500 nm.

When the device 100 corresponds to an actuator, the piezoelectric material of the piezoelectric layer 116 may have a transverse piezoelectric coefficient d31 the highest possible. This is the case of PZT (or doped PZT (La, Mn, Nb)), KNN, or NBT-BT, or instead PMN-PT. When the device 100 corresponds to a sensor, the piezoelectric material of the piezoelectric layer 116 may be chosen such that it represents the best compromise between a high transverse piezoelectric coefficient e31 and a low dielectric permittivity $\varepsilon_r$, that is to say with the highest Figure of Merit FOM=e31/$\varepsilon_r$. Finally, it is possible that the device 100 corresponds to a device forming both an actuator and a sensor.

Finally, the device 100 comprises another electrode, called first electrode 118, arranged on the piezoelectric layer 116. Like the second electrode 112, the first electrode 118 comprises an electrically conductive material, for example platinum and/or ruthenium and/or iridium, and has a thickness which is for example comprised between around 1 nm and 500 nm and here equal to around 100 nm. The material and/or the thickness of the first electrode 118 may be similar to the material and/or to the thickness of the second electrode 112. Advantageously, when the piezoelectric layer 116 is formed (during the production of the device 100) on the layer serving to form the first electrode 118, the first electrode 118 comprises platinum in order to facilitate the growth of the piezoelectric material of the piezoelectric layer 116.

In this first embodiment, the electrodes 112, 118 of the device 100 are each arranged on a side of the piezoelectric layer 116. The device 100 according to this first embodiment thus operates by using the transverse piezoelectric coefficient d31 of the piezoelectric material.

In this first embodiment, the piezoelectric layer 116 is in contact with the silicon and/or silicon nitride layer of the membrane 108 solely through metal layers which here correspond to the second electrode 112 and to the tie layer 114.

In this device 100, the absence a of $SiO_2$ layer between the piezoelectric layer 116 and the membrane 108 does not pose a problem of disbondment of the piezoelectric material during the production of the device 100 because, as is described hereafter, in the course of the method for producing the device 100, the piezoelectric layer 116 is not produced from the membrane 108 but on a temporary substrate different from the substrate 102.

Figure 2:
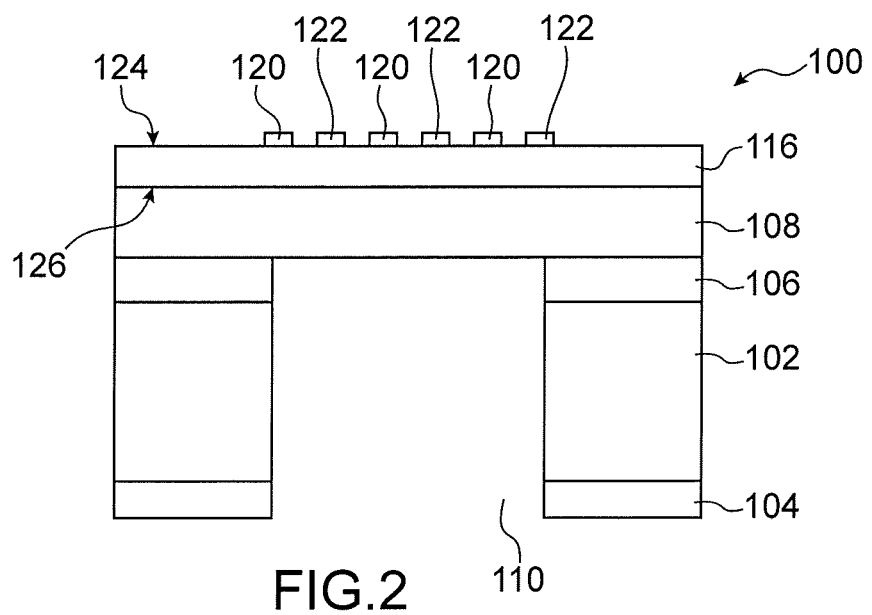

The device 100 according to a second embodiment is described below in relation with FIG. 2.

As in the first embodiment, the device 100 according to this second embodiment comprises the substrate 102, the first and second oxide layers 104, 106, the membrane 108, the cavity 110 and the piezoelectric layer 116.

Conversely, unlike the first embodiment in which the first and second electrodes 112, 118 are arranged on the two main faces of the piezoelectric layer 116, the device 100 according to the second embodiment comprises first and second electrodes 120, 122 arranged on a single face of the piezoelectric layer 116, called first face 124. The second face 126 of the piezoelectric layer 116, opposite to the first face 124, is in direct contact with the membrane 108. The first and second electrodes 120, 122 are here produced according to an interdigitated comb pattern, and are for example derived from a same metal layer.

In this second embodiment, the device 100 operates by using the longitudinal piezoelectric coefficient d33 of the piezoelectric material.

As in the first embodiment, the absence of a $SiO_2$ layer between the piezoelectric layer 116 and the membrane 108 does not pose a problem of disbandment of the material of the piezoelectric layer 116 because, as is described hereafter, in the course of the method for producing the device 100, the piezoelectric layer 116 is not produced on the membrane 108 but on a temporary substrate different from the substrate 102. Moreover, the absence of a metal layer between the piezoelectric layer 116 and the membrane 108 is not problematic for the production of the piezoelectric material of the layer 116 since the piezoelectric layer 116 is not produced from the membrane 108 but on a temporary substrate on which a metal layer may be arranged to form the piezoelectric layer 116.

In this second embodiment, the piezoelectric layer 116 is in direct contact with the silicon and/or silicon nitride layer of the membrane 108.

In an alternative, as in the first embodiment, the membrane 108 may correspond to a $SiO_2$ layer arranged between two silicon and/or silicon nitride layers.

An example of method for producing the device 100 according to the first embodiment is described below in relation with FIGS. 3A to 3C.

Figure 3A:
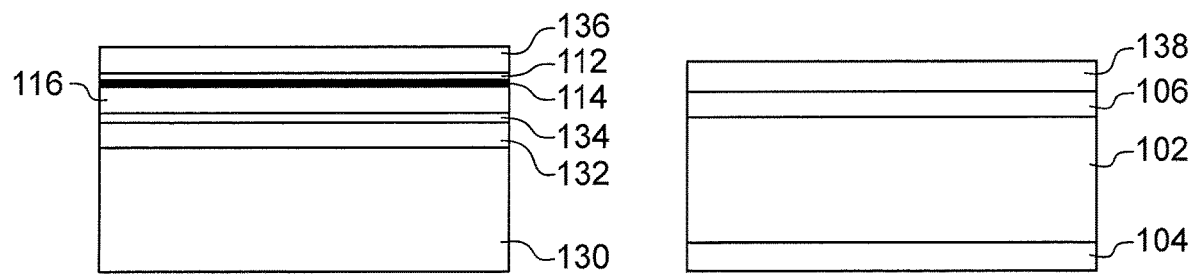
FIGS. 3A to 3C show the steps of a method for producing the piezoelectric transducer device according to the first embodiment.

As shown in FIG. 3A, firstly on a temporary substrate 130, which here corresponds to a semiconductor substrate including for example silicon and of which the thickness is for example comprised between around 100 µm and 1 mm, is produced a low adherence interface intended to form later a separation interface to detach the temporary substrate 130 from the elements of the device 100.

This low adherence force interface is formed by a first separation layer 132 here including at least $SiO_2$ and/or silicon nitride such as SiN and/or $Si_3N_4$, and a second separation layer 134 including at least one noble metal. The low adherence force interface corresponds to the interface between these two separation layers 132, 134, and is obtained thanks to the nature of the materials of the separation layers 132, 134 which only adhere weakly to each other.

The material of the first separation layer 132 may advantageously correspond to $SiO_2$. The first separation layer 132 is for example produced by thermal oxidation of the upper face of the temporary substrate 130. The thickness of the first separation layer 132 is for example comprised between around 1 nm and 20 µm, and here for example equal to around 500 nm.

Optionally, it is possible to implement a de-oxidation of the rear face of the temporary substrate 130 in order to remove the oxide formed on the rear face of the temporary substrate 130 during the preceding step of oxidation forming the first separation layer 132.

The noble metal of the second separation layer 134, for example produced by PVD (physical vapour deposition) of the noble metal on the first separation layer 132, comprises at least one of the following elements: platinum, gold, silver, rhodium, osmium, palladium, ruthenium, iridium. Due to the fact that this second separation layer 134 is here intended to serve for the production of the first electrode 118 and to serve for the growth of the piezoelectric material of the piezoelectric layer 116, this second separation layer 134 advantageously comprises platinum. The thickness of the second separation layer 134 is for example comprised between around 1 nm and 200 nm, and here for example equal to around 100 nm.

The piezoelectric layer 116 is next produced on the second separation layer 134, for example by a sol-gel method of the piezoelectric material, advantageously PZT. A crystallisation and densification annealing of the piezoelectric material of the layer 116 is notably implemented at this stage of the method in the course of the production of the piezoelectric layer 116.

The layer intended to form the second electrode 112 is next deposited on the piezoelectric layer 116. In the exemplary embodiment described here, this deposition is preceded by a deposition of the tie layer 114 in order to favour the adhesion of the metal deposited next to form the second electrode 112.

A first bonding layer 136, here corresponding to a silicon and/or silicon nitride layer, is next produced on the second electrode 112. In the production method described here, this first bonding layer is intended to ensure the bonding of the layers produced on the temporary substrate 130 with the substrate 102 (receiver substrate) of the device 100, but also to form a part of the membrane 108. The thickness of the first bonding layer 136 is for example comprised between around 1 nm and 1 mm, as a function notably of the thickness desired for the membrane 108. In the exemplary embodiment described here, the first bonding layer 136 comprises silicon and has a thickness equal to around 500 nm. The first bonding layer 136 is for example produced by PVD.

In parallel to these steps, the substrate 102 is prepared to receive the stack of materials formed on the temporary substrate 130. The front and rear faces of the substrate 102 are for example oxidised, forming the first and second oxide layers 104, 106. A second bonding layer 138, here corresponding to a silicon and/or silicon nitride layer, is deposited on the second oxide layer 106, and is adapted to be able to be bonded by direct bonding with the first bonding layer 136. This second bonding layer 138 is for example similar to the first bonding layer 136, and here corresponds to a silicon layer of thickness equal to around 500 nm.

Each of the two bonding layers 136, 138 here has properties suited to direct bonding: very low roughness, suitable material, etc.

Figure 3B:
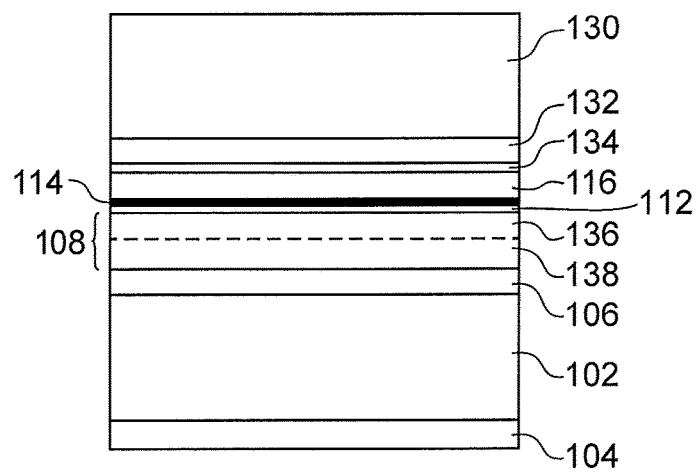

A direct bonding is next carried out between the two bonding layers 136, 138 (FIG. 3B). Within the stack thereby obtained, the low adherence force interface formed between the separation layers 132, 134 corresponds, among all the interfaces of the stack, to that which has the lowest adherence force between two successive layers of the stack. Moreover, the silicon layer obtained by the direct bonding of the bonding layers 136, 138 is going to make it possible to form the membrane 108.

The second oxide layer 106 serves as electrical insulation layer between the substrate 102 and the other layers arranged on the second oxide layer 106.

Figure 3C:
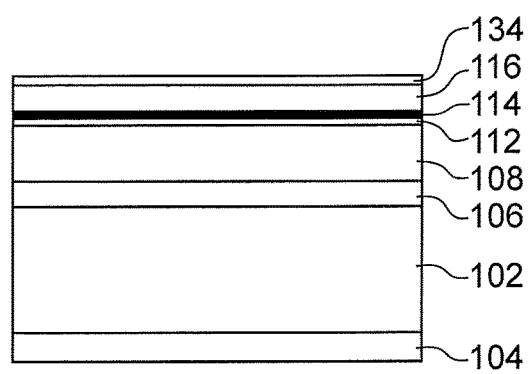

A mechanical separation is next carried out at the low adherence force interface between the separation layers 132, 134 (FIG. 3C). This mechanical separation is for example carried out by introducing a blade between the two wafers. The second separation layer 134 is next etched such that at least one remaining portion of this second separation layer 134 forms the first electrode 118. In an alternative, it is possible to completely remove the second separation layer 134, then to deposit a new electrically conductive layer suited to the production of the first electrode 118.

The device 100 is terminated by etching, from the first oxide layer 104 and through the oxide layers 104, 106 and the substrate 102, the cavity 110, thereby releasing the membrane 108. The device 100 obtained corresponds to that shown in FIG. 1.

At the end of this production method, the temporary substrate 130 may be reused to produce other devices.

In the exemplary embodiment described here, the rear face of the substrate 102 is covered with the oxide layer 104. In an alternative, it is possible to remove this oxide layer 104 by carrying out a de-oxidation of the rear face of the substrate 102, as for the temporary substrate 130.

In the method described in relation with FIGS. 3A to 3C, the first separation layer 132 comprises $SiO_2$ and/or silicon nitride and the second separation layer 134 comprises the noble metal. This is advantageous when the material of the second separation layer 134 is next used for the production of the first electrode 118. According to an alternative embodiment, it is however possible that the first separation layer 132 comprises the noble metal and that the second separation layer 134 comprises $SiO_2$ and/or silicon nitride. In this case, after the mechanical separation between the separation layers 132, 134, the second separation layer 134 is etched then an electrically conductive layer is deposited and etched to produce the first electrode 118.

In the production method described previously, the low adherence force interface is formed thanks to the intrinsic properties of the materials of the separation layers 132, 134, due to the fact that $SiO_2$ and/or silicon nitride and a noble metal adhere poorly to each other.

In an alternative, it is possible that the low adherence force of the interface between the temporary substrate 130 and the layers of the device 100 to transfer onto the definitive substrate (substrate 102) of the device 100 is obtained thanks to the implementation of at least one specific step voluntarily degrading the adherence properties of this interface and reducing the adherence force at this interface between the materials of the first and second separation layers 132, 134. As an example, during the deposition of the piezoelectric layer 116 on the second separation layer 134, it is possible to implement a thermal treatment making atoms of lead coming from the PZT of the piezoelectric layer 116 diffuse into the $SiO_2$ of the first separation layer 132, through the second separation layer 134 which comprises for example platinum. With such a thermal treatment, for example implemented at a temperature greater than or equal to around 700° C., a $SiO_2$+Pb mixture in liquid phase forms at the interface between the first and second separation layers 132, 134. When the temperature drops, cavities are then created at this interface, in the layer formed of the mixture of $SiO_2$ and lead. These cavities reduce the adherence between the separation layers 132, 134.

This degradation, or reduction, of the adherence force of the interface between the separation layers 132, 134 may thus be carried out when the intrinsic properties of the materials used for these separation layers 132, 134 do not bring about, without additional intervention, the formation of a low adherence force interface. Thus, other materials, such as for example $TiO_2$, $ZrO_2$ or instead ZnO or $Ta_2O_5$, may be used to form one of the two separation layers 132, 134.

In the method described previously, the membrane 108 corresponds to a silicon and/or silicon nitride layer formed by making the two bonding layers 136, 138 integral one against the other. In an alternative, it is possible that the first bonding layer 136 corresponds to a stack of a first silicon and/or silicon nitride layer and of a first $SiO_2$ layer such that this first silicon and/or silicon nitride layer is arranged between the first $SiO_2$ layer and the piezoelectric layer 116. The second bonding layer 138 also comprises in this case a second silicon and/or silicon nitride layer and a second $SiO_2$ layer such that the second silicon and/or silicon nitride layer is arranged between the second $SiO_2$ layer and the second substrate 102. The making integral step then corresponds to a direct bonding between the first and second $SiO_2$ layers, forming a membrane 108 including a $SiO_2$ layer arranged between two silicon and/or silicon nitride layers.

An example of method for producing the device 100 according to the second embodiment is described below in relation with FIGS. 4A to 4C.

As in the production method described previously in relation with FIGS. 3A-3C, the layers 116, 134, 132 are produced on the donor substrate 130. Given that the electrodes 120, 122 of the device 100 will only be arranged on the first face 124 of the piezoelectric layer 116, no electrode layer is produced on the piezoelectric layer 116. The first bonding layer 136 is thus produced on the piezoelectric layer 116, in direct contact therewith.

Figure 4A:
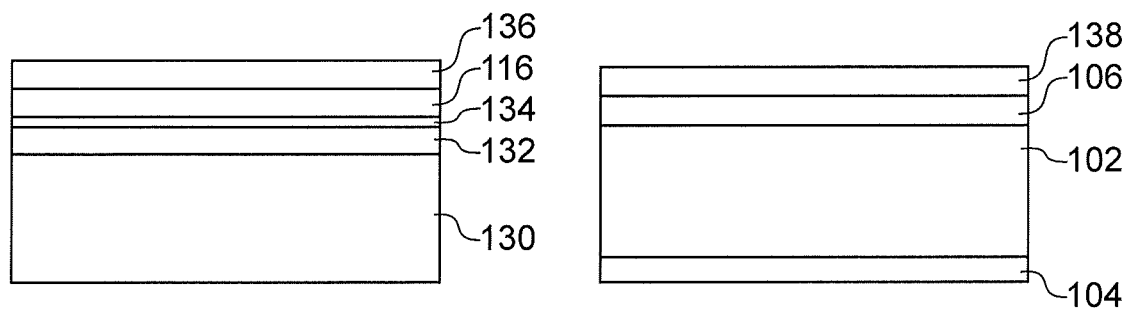
FIGS. 4A to 4C show the steps of a method for producing the piezoelectric transducer device according to the second embodiment.

In parallel with these steps, and as in the method described previously in relation with FIGS. 3A-3C, the substrate 102 is prepared to receive the stack of materials formed on the temporary substrate 130, via the formation of the first and second oxide layers 104, 106 and the second bonding layer 138 (FIG. 4A).

Figure 4B:
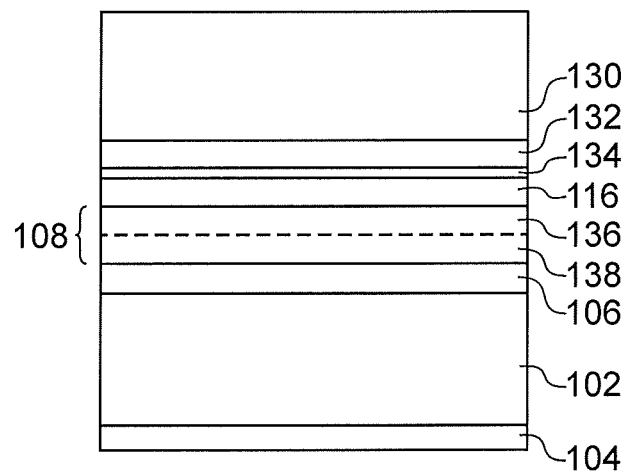

The bonding layers 136, 138 are next made integral with each other by the implementation of a direct bonding (FIG. 4B).

Figure 4C:
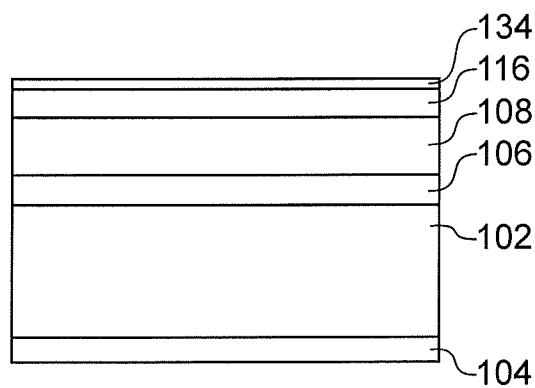

A mechanical separation is next carried out at the lowest adherence force interface, between the separation layers 132, 134, with the first separation layer 132 which remains integral with the donor substrate 130, and the second separation layer 134 which remains integral with the layers arranged on the substrate 102 (FIG. 4C).

The second separation layer 134 may next be etched to form the first and second electrodes 120, 122 of the device 100.

The different alternative embodiments of the production method described previously for the production of the device 100 according to the first embodiment may also apply to the method for producing the device 100 according to the second embodiment.

Figure 5A:
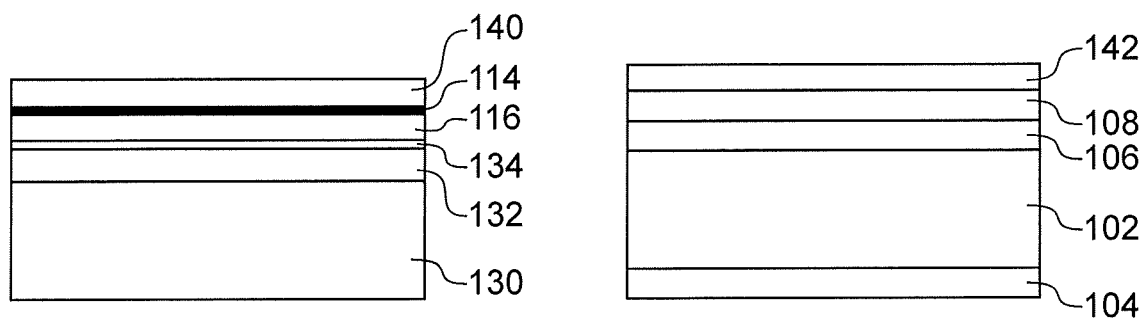
FIGS. 5A to 5C show the steps of another method for producing the piezoelectric transducer device according to the first embodiment.

Another method for producing the device 100 according to the first embodiment is described below in relation with FIGS. 5A-5C.

As in the production method described previously in relation with FIGS. 3A-3C, the layers 114, 116, 134, 132 are produced on the temporary substrate 130.

In this other embodiment, the second electrode 112 is intended to be formed by two metal bonding layers 140, 142 made integral with each other. A first metal bonding layer 104 is produced on the tie layer 114.

In parallel with these steps, and as in the method described previously in relation with FIGS. 3A-3C, the substrate 102 is prepared to receive the stack of materials formed on the temporary substrate 130, via the formation of the first and second oxide layers 104, 106. However, in this other production method, given that the two bonding layers used to make the temporary substrate 130 integral with the definitive substrate 102 are intended to form together the second electrode 112 and not the membrane 108, at least one silicon and/or silicon nitride layer configured to form the membrane 108 is deposited on the second oxide layer 106. The second metal bonding layer 142 is next produced on the membrane 108 (FIG. 5A). In an alternative, it is also possible that the second metal bonding layer 142 is formed on a membrane 108 corresponding to a $SiO_2$ layer arranged between two silicon and/or silicon nitride layers (one of these two silicon and/or silicon nitride layers being arranged between the $SiO_2$ layer and the substrate 102, and the other of the two silicon and/or silicon nitride layers being arranged between the $SiO_2$ layer and the second metal bonding layer 142).

These metal bonding layers 140, 142 correspond for example to layers including copper and/or gold, and of which the thickness is for example comprised between around 1 nm and 100 μm. In the example described here, each of the metal bonding layers 140, 142 comprises gold and has a thickness equal to around 50 nm.

A direct bonding or bonding by thermocompression is next implemented between the two metal bonding layers 140, 142. In the case of bonding by thermocompression, this is for example implemented at a temperature comprised between around 20° C. and 400° C., and for example less than around 150° C., by applying a compressive force comprised between around 1 kN and 50 kN, and for a duration for example comprised between around 1 min and 30 min. The force and the duration with which the bonding by thermocompression is implemented are notably a function of the thicknesses of the metal bonding layers 140, 142. The parameters for implementing this thermocompression are adapted notably as a function of the properties of the metal bonding layers 140, 142.

Figure 5B:
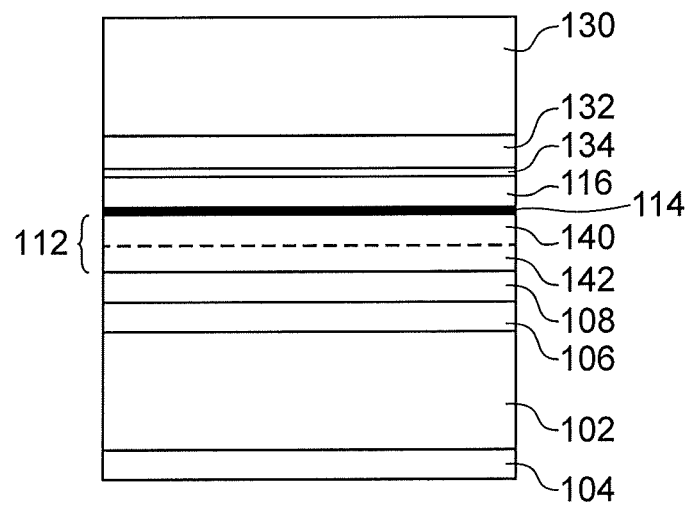

In the structure obtained, the metal bonding layers 140, 142 form together the second electrode 112 (FIG. 5B).

Figure 5C:
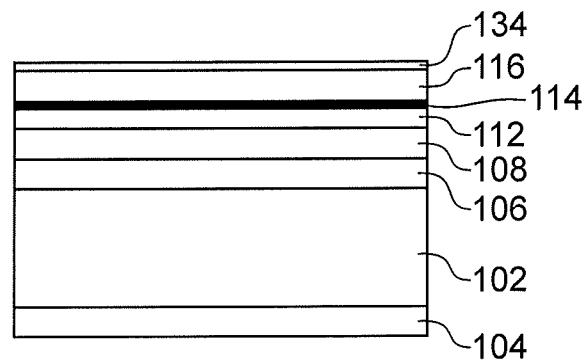

A mechanical separation is next carried out at the lowest adherence force interface, between the separation layers 132, 134, with the first separation layer 132 which remains integral with the donor substrate 130, and the second separation layer 134 which remains integral with the layers arranged on the substrate 102 (FIG. 5C).

The second separation layer 134 may next be etched to form the first electrode 118 of the device 100.

The different alternative embodiments of the production method described previously for the production of the device 100 according to the first embodiment may also apply to this other method for producing the device 100.

The invention claimed is:

1. A method for producing a piezoelectric transducer device, comprising:
    producing, on a face of a first substrate, first and second separation layers arranged one against the other and such that the first separation layer is arranged between the first substrate and the second separation layer;
    producing, on the second separation layer, at least one piezoelectric layer including at least one piezoelectric material with a crystalline perovskite structure, after producing the second separation layer;
    making the piezoelectric layer integral with a second substrate, forming a stack in which the piezoelectric layer is arranged between the second substrate and the second separation layer, and in which at least one membrane including at least one of a silicon (Si) layer and a silicon nitride layer is arranged between the piezoelectric layer and the second substrate such that the piezoelectric layer is in direct contact with the at least one membrane that only one or more electrically conductive layers are disposed between the piezoelectric layer and the at least one membrane;
    forming a mechanical separation at an interface between the first and the second separation layers; and
    producing first and second electrodes electrically in contact with the piezoelectric layer,
    wherein the interface between the first and the second separation layers has a lowest adherence force among all interfaces of the stack including at least an interface between the first substrate and the first separation layer, the interface between the first and the second separation layers, an interface between the second separation layer and the at least one piezoelectric layer, an interface between the at least one piezoelectric layer and the membrane or between the at least one piezoelectric layer and the one or more electrically conductive layers, and an interface between the membrane and the second substrate.

2. The method according to claim 1,
further comprising, between the step of producing the piezoelectric layer and the step of making the piezoelectric layer integral with the second substrate, a step of producing, on the piezoelectric layer, a first bonding layer including at least one of silicon and silicon nitride,
wherein the making integral step is implemented by direct bonding between the first bonding layer and a second bonding layer including at least one of silicon and silicon nitride and arranged on the second substrate, and
wherein production of the membrane comprises a step of producing a cavity in the second substrate such that a part of the first and the second bonding layers arranged facing the cavity forms the membrane.

3. The method according to claim 2, further comprising, between the step of producing the piezoelectric layer and the step of producing the first bonding layer, a step of producing, on the piezoelectric layer, at least one metal layer configured to form the second electrode of the device, wherein the first electrode is produced on the piezoelectric layer after the step of forming the mechanical separation.

4. The method according to claim 3,
wherein the second separation layer comprises a noble metal, and
wherein the first electrode is produced by etching the second separation layer such that at least one remaining portion of the second separation layer forms the first electrode.

5. The method according to claim 2,
wherein the first bonding layer is produced directly against the piezoelectric layer, and
wherein the first and the second electrodes are produced on the piezoelectric layer after the step of forming the mechanical separation.

6. The method according to claim 5,
wherein the second separation layer comprises a noble metal, and
wherein the first and the second electrodes are produced by etching the second separation layer such that the remaining portions of the second separation layer form the first and second electrodes having an interdigitated comb pattern.

7. The method according to claim 2,
wherein the first bonding layer comprises a first $SiO_2$ layer and at least one of a first silicon layer and a first silicon nitride layer such that the at least one of the first silicon layer and silicon nitride layer is arranged between the first $SiO_2$ layer and the piezoelectric layer, and
wherein the second bonding layer comprises a second $SiO_2$ layer and at least one of a second silicon layer and a second silicon nitride layer and such that the at least one of the second silicon layer and second silicon nitride layer is arranged between the second $SiO_2$ layer and the second substrate.

8. The method according to claim 1,
further comprising, between the step of producing the piezoelectric layer and the step of making the piezoelectric layer integral with the second substrate, a step of producing, on the piezoelectric layer, a first metal bonding layer, wherein the making integral step is implemented by direct bonding or by thermocompression between the first metal bonding layer and a second metal bonding layer made integral with the second substrate through the silicon and/or silicon nitride layer of the membrane, wherein production of the membrane comprises a step of producing a cavity in the second substrate such that a part of the silicon and/or silicon nitride layer arranged facing the cavity forms at least one part of the membrane, and wherein the first and the second metal bonding layers together form the second electrode of the device.

9. The method according to claim 8, wherein the second separation layer comprises a noble metal, and wherein the first electrode is produced by etching the second separation layer such that at least one remaining portion of the second separation layer forms the first electrode.

10. The method according to claim 8, wherein the membrane comprises at least one SiO$_2$ layer arranged between two silicon and/or silicon nitride layers.

11. The method according to claim 1, comprising, between the step of producing the first and the second separation layers and the making integral step, reducing an adherence force of the interface between the first and the second separation layers by processing the interface between the first and second separation layers.

12. The method according to claim 1, comprising forming the piezoelectric layer directly on at least one of the silicon (Si) layer and the silicon nitride layer of the at least one membrane.

13. The method according to claim 1, wherein one of the first and the second separation layers comprises at least one of SiO$_2$ and silicon nitride and the other of the first and the second separation layers comprises at least one noble metal.

14. The method according to claim 13, wherein the noble metal comprises platinum.

15. The method according to claim 11, wherein:

the piezoelectric material comprises lead, the first separation layer comprises SiO$_2$, and the reducing the adherence force of the interface between the first and the second separation layers comprises implementation of at least one thermal treatment forming, at the interface between the first and the second separation layers, an alloy of lead and SiO$_2$ in liquid phase, then a cooling forming cavities at the interface between the first and the second separation layers.

16. The method according to claim 13, comprising, between the step of producing the first and the second separation layers and the making integral step, reducing an adherence force of the interface between the first and the second separation layers.

17. The method according to claim 1, comprising:

producing the first separation layer to be integral with the first substrate, and forming the mechanical separation at the interface between the first and the second separation layers such that the first separation layer remains integral with the first substrate and that the second separation layer remains integral with the piezoelectric layer.

18. The method according to claim 1, comprising:

making the piezoelectric layer integral with the second substrate after producing the at least one piezoelectric layer.

* * * * *